(12) United States Patent
Kim et al.

(10) Patent No.: US 11,456,372 B2
(45) Date of Patent: Sep. 27, 2022

(54) MULTI-HEIGHT FINFET DEVICE BY SELECTIVE OXIDATION

(71) Applicant: Intel Corporation, Santa Clara, CA (US)

(72) Inventors: Seiyon Kim, Portland, OR (US); Gopinath Bhimarasetti, Portland, OR (US); Rafael Rios, Austin, TX (US); Jack T. Kavalieros, Portland, OR (US); Tahir Ghani, Portland, OR (US); Anand S. Murthy, Portland, OR (US); Rishabh Mehandru, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/576,251

(22) PCT Filed: Jun. 27, 2015

(86) PCT No.: PCT/US2015/038194
§ 371 (c)(1),
(2) Date: Nov. 21, 2017

(87) PCT Pub. No.: WO2017/003411
PCT Pub. Date: Jan. 5, 2017

(65) Prior Publication Data
US 2018/0151702 A1    May 31, 2018

(51) Int. Cl.
*H01L 29/10* (2006.01)
*H01L 29/66* (2006.01)
(Continued)

(52) U.S. Cl.
CPC .. *H01L 29/66795* (2013.01); *H01L 21/02233* (2013.01); *H01L 27/0886* (2013.01);
(Continued)

(58) Field of Classification Search
CPC ......... H01L 29/66785–66818; H01L 27/0886; H01L 21/823481; H01L 21/0223–02233;
(Continued)

(56) References Cited

U.S. PATENT DOCUMENTS 4,806,505 A * 2/1989 Franciosi .......... H01L 21/31654
438/767
6,642,090 B1    11/2003 Fried
(Continued)

FOREIGN PATENT DOCUMENTS

CN    103811346    5/2014
EP    0 757 379    2/1997
(Continued)

OTHER PUBLICATIONS

International Search Report and Written Opinion for International Patent Application No. PCT/US2015/038194 dated Mar. 25, 2016, 12 pgs.
(Continued)

*Primary Examiner* — Eric K Ashbahian
(74) *Attorney, Agent, or Firm* — Schwabe, Williamson & Wyatt, P.C.

(57) ABSTRACT

A method including forming a non-planar conducting channel of a multi-gate device on a substrate, the channel including a height dimension defined from a base at a surface of the substrate; modifying less than an entire portion of the channel; and forming a gate stack on the channel, the gate stack including a dielectric material and a gate electrode. An apparatus including a non-planar multi-gate device on a substrate including a channel including a height dimension defining a conducting portion and an oxidized portion and a gate stack disposed on the channel, the gate stack including a dielectric material and a gate electrode.

15 Claims, 6 Drawing Sheets

(51) Int. Cl.
*H01L 29/78* (2006.01)
*H01L 27/12* (2006.01)
*H01L 21/02* (2006.01)
*H01L 27/088* (2006.01)
*H01L 23/498* (2006.01)
*H01L 29/08* (2006.01)

(52) U.S. Cl.
CPC ...... *H01L 27/1211* (2013.01); *H01L 29/1037* (2013.01); *H01L 29/1083* (2013.01); *H01L 29/66545* (2013.01); *H01L 29/78* (2013.01); *H01L 29/785* (2013.01); *H01L 29/7851* (2013.01); *H01L 21/02546* (2013.01); *H01L 23/49827* (2013.01); *H01L 23/49838* (2013.01); *H01L 29/0847* (2013.01)

(58) Field of Classification Search
CPC ......... H01L 21/76237; H01L 21/76202; H01L 29/1083
See application file for complete search history.

(56) References Cited

U.S. PATENT DOCUMENTS

| | | | |
|---|---|---|---|
| 8,106,459 B2* | 1/2012 | Chang | H01L 27/1207 257/353 |
| 2013/0087845 A1* | 4/2013 | Yasuda | H01L 21/28282 257/324 |
| 2013/0181263 A1 | 7/2013 | Cai | |
| 2013/0270638 A1* | 10/2013 | Adam | H01L 29/66795 257/E21.409 |
| 2013/0280883 A1* | 10/2013 | Faul | H01L 21/2255 438/434 |
| 2014/0117462 A1* | 5/2014 | Cheng | H01L 29/66803 257/410 |
| 2014/0124863 A1* | 5/2014 | Cheng | H01L 27/1211 257/350 |
| 2014/0264592 A1* | 9/2014 | Oxland | H01L 29/785 257/347 |
| 2014/0312432 A1 | 10/2014 | Ching | |
| 2015/0008483 A1* | 1/2015 | Ching | H01L 29/7856 257/190 |
| 2015/0021691 A1* | 1/2015 | Akarvardar | H01L 29/785 257/349 |
| 2015/0028398 A1 | 1/2015 | Cheng | |
| 2015/0102411 A1 | 4/2015 | Ching et al. | |
| 2015/0108572 A1* | 4/2015 | Cheng | H01L 27/1211 257/347 |
| 2015/0137237 A1* | 5/2015 | Jacob | H01L 29/66795 257/347 |
| 2015/0145064 A1 | 5/2015 | Ramachandran | |
| 2015/0162436 A1 | 6/2015 | Toh | |
| 2015/0221761 A1* | 8/2015 | Tan | H01L 29/785 257/347 |
| 2015/0262861 A1* | 9/2015 | Hung | H01L 21/823431 438/439 |
| 2016/0093726 A1* | 3/2016 | Ching | H01L 29/785 257/192 |
| 2016/0104776 A1* | 4/2016 | Ching | H01L 29/1083 257/401 |

FOREIGN PATENT DOCUMENTS

| | | |
|---|---|---|
| KR | 10-2008-0071822 | 8/2008 |
| KR | 10-2010-0026423 | 3/2010 |
| WO | WO 2015/199705 | 12/2015 |

OTHER PUBLICATIONS

International Preliminary Report on Patentability for International Patent Application No. PCT/US2015/038194, dated Jan. 11, 2018, 10 pages.
Partial Search Report for European Patent Application No. 15897302. 4, dated Jan. 29, 2019, 6 pgs.
Search Report for European Patent Application No. 15897302.4, dated Apr. 29, 2019, 12 pgs.
Office Action from Taiwan Patent Application No. 105116135, dated Dec. 10, 2019, 28 pages.
Office Action from Taiwan Patent Application No. 105116135, dated Dec. 23, 2020, 36 pages.
Satoshi Kitaoka, Tsuneaki Matsudaira and Masashi Wada, Mass-Transfer Mechanism of Alumina Ceramics under Oxygen Potential Gradients at High Temperatures, Materials Transactions, vol. 50, No. 5 (2009) pp. 1023 to 1031, Apr. 25, 2009, 9 pgs.
Office Action from Chinese Patent Application No. 201580080408. 7, dated Jul. 13, 2020, 9 pages.
Office Action from Taiwan Patent Application No. 105116135, dated Apr. 20, 2020, 7 pages.
Office Action from Chinese Patent Application No. 201580080408. 7, dated Mar. 19, 2021, 7 pages.
Office Action from Korean Patent Application No. 10-2018-7002564 dated Aug. 16, 2021, 8 pgs, with English translation.
Notice of Allowance from Chinese Patent Application No. 201580080408.7, dated Jun. 29, 2021, 4 pgs.
Notice of Allowance from Taiwan Patent Application No. 105116135 dated Sep. 6, 2021, 3 pgs.
Notice of Allowance from Korean Patent Application No. 10-2018-7002564, dated Feb. 7, 2022, 3 pages.

* cited by examiner

MULTI-HEIGHT FINFET DEVICE BY SELECTIVE OXIDATION

CROSS-REFERENCE TO RELATED APPLICATION

This patent application is a U.S. National Phase Application under 35 U.S.C. § 371 of International Application No. PCT/US2015/038194, filed Jun. 27, 2015, entitled "MULTI-HEIGHT FINFET DEVICE BY SELECTIVE OXIDATION," which designates the United States of America, the entire disclosure of which is hereby incorporated by reference in its entirety and for all purposes.

TECHNICAL FIELD

Semiconductor devices including non-planar semiconductor devices having channel regions with low band-gap cladding layers.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased capacity. The drive for ever-more capacity, however, is not without issue. The necessity to optimize the performance of each device becomes increasingly significant.

Future circuit devices, such as central processing unit devices, will desire both high performance devices and low capacitance, low power devices integrated in a single dye or chip. Currently, three-dimensional non-planar metal oxide semiconductor field-effect transistors (MOSFETs) generally utilize fins of a single height. Single height fins tend to limit design, and require compromises.

DESCRIPTION OF THE EMBODIMENTS

Embodiments described herein are directed to non-planar semiconductor devices (e.g., three-dimensional devices) having a targeted or predetermined fin or channel heights and methods of making non-planar semiconductor devices of a targeted or predetermined fin or channel height on a substrate wherein such fin height may be one of multiple fin heights of devices on the substrate. In one such embodiment, a gate stack of a non-planar device surrounds a channel region of the fin (such as a tri-gate or fin-fet device). The methods allow incorporating three-dimensional devices having different fin heights on a chip or die such as high performance devices requiring high current with low capacitance, lower power devices.

FIGS. 1-11 describe a method or process of modifying a fin or channel height of a non-planar multi-gate semiconductor device from an initial fin height to a targeted fin height that is different from the initial fin height. In one embodiment, the device is a three-dimensional metal oxide semiconductor field effect transistor (MOSFET) and is an isolated device or is one device in a plurality of nested devices. As will be appreciated, for a typical integrated circuit, both N- and P-channel transistors may be fabricated on a single substrate to form a complimentary metal oxide semiconductor (CMOS) integrated circuit. Furthermore, additional interconnect may be fabricated in order to integrate such devices into an integrated circuit.

Figure 1:
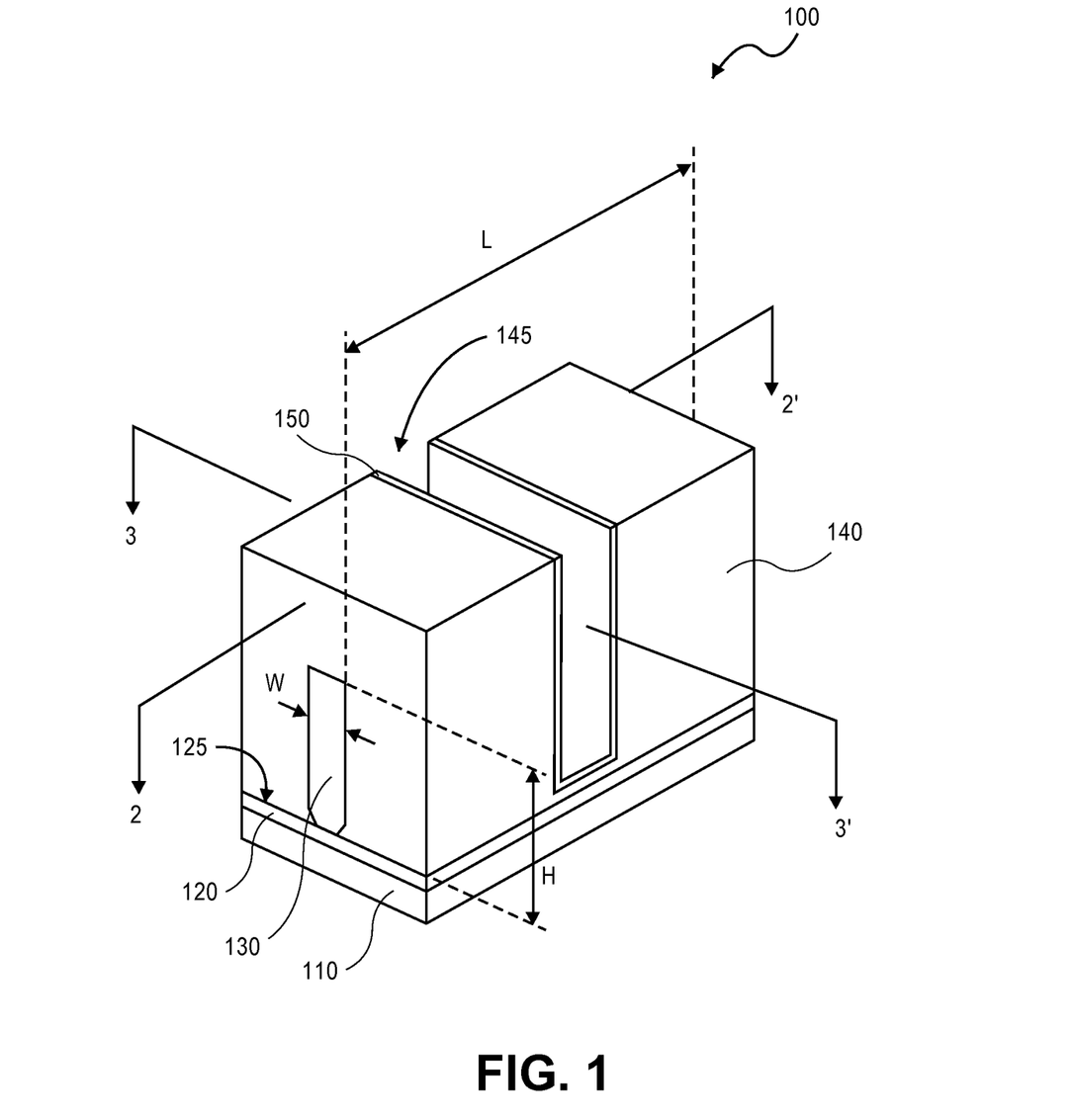
FIG. 1 shows a top side perspective view of a portion of a substrate that is, for example, a portion of an integrated circuit die or chip on a wafer and has a portion of three-dimensional circuit device formed thereon.

FIG. 1 shows a top side perspective view of a portion of a silicon or silicon-on-insulator (SOI) substrate that is, for example, a portion of an integrated circuit die or chip on a wafer. Specifically, FIG. 1 shows structure 100 including substrate 110 of silicon or SOI. Overlaying substrate 110 is optional buffer layer 120. In one embodiment, buffer layer is a silicon germanium buffer introduced, in one embodiment, on substrate 110 by a growth technique. Buffer layer 120 has a representative thickness on the order of a few hundred nanometers (nm).

Disposed on a surface of buffer layer 120, in the embodiment illustrated in FIG. 1, is a portion of a transistor device such as an N-type transistor device or a P-type transistor device. Common to an N-type or P-type transistor device, in this embodiment, is fin 130 disposed on a surface (surface 125) of buffer layer 120. A representative material for fin 130 is a group III-V semiconductor material such as an Indium Gallium Arsenide (InGaAs) material. In one embodiment, fin 130 has a length dimension, L, greater than a height dimension, H. A representative length range is on the order of 10 nm to 1 millimeter (mm), and a representative height range is on the order of 5 nm to 200 nm. Fin 130 also has a width, W, representatively on the order of 4-10 nm. As illustrated, fin 130 is three-dimensional body extending from surface 125 of substrate 110 (or optionally from buffer layer 120). The three-dimensional body as illustrated in FIG. 1 is a rectangular body, but it is appreciated that in processing of such bodies, a true rectangular form may not be achievable with available tooling, and other shapes may result. Representative shapes include, but are not limited to, a trapezoidal shape (e.g., base wider than top) and an arch shape.

Disposed on fin 130, in one embodiment, is dielectric material 140 of, for example, silicon dioxide, or a dielectric material having a dielectric constant (k) less than silicon dioxide (a low-k dielectric). Dielectric material 140 is introduced to a thickness suitable for a gate electrode structure. FIG. 1 shows spacers 150 defining a region for a gate electrode. Typically, spacers 150 would be deposited along with a sacrificial or dummy gate electrode on a designated channel region of fin 130 (identified as fin or channel 1300 herein), followed by the formation of junction regions and the introduction of dielectric material 140. Accordingly, for purposes of this embodiment, such sacrificial or dummy gate electrode was previously deposited in gate electrode region 145 and junction regions were formed as desired according to conventional processing techniques followed by dielectric material 140 deposition. In the illustration shown in FIG. 1, the sacrificial or dummy gate has been removed, such as by an etch process, leaving fin or channel 1300 exposed in gate electrode region 145.

Figure 2:
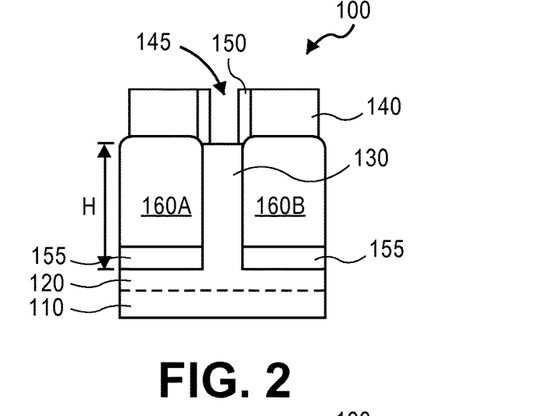
FIG. 2 shows a cross-sectional side view of the structure of FIG. 1 through line 2-2'.
Figure 3:
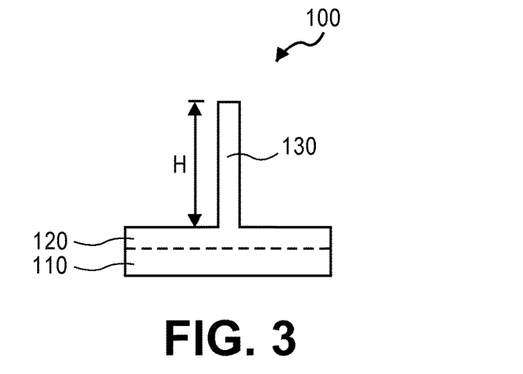
FIG. 3 shows the structure of FIG. 1 through line 3-3'.

FIG. 2 shows a cross-sectional side view of the structure of FIG. 1 through line 2-2'. FIG. 3 shows the structure of FIG. 1 through line 3-3'. Referring to FIG. 2, structure 100 shows fin or channel 1300 having a height, H, disposed between junction region 160A and junction region 160B (source and drain regions, respectively). Junction regions 160A and 160B may be doped group III-V compound material regions. Beneath each of junction region 160A and junction region 160B is dopant or implant region 155. The junction regions and dopants/implants are formed according to conventional processes. Overlying or on junction regions 160A/160B (as viewed) is dielectric material 140 and spacers 150 defining gate electrode region 145. FIG. 3 shows structure 100 taken through fin or channel 1300 in gate electrode region 145, and shows fin 130 on the substrate having a height, H.

Figure 4:
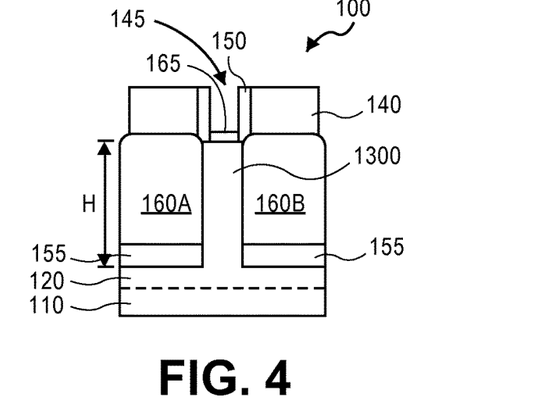
FIG. 4 shows the structure of FIG. 2 following the introduction of a catalyst layer on the fin of the device.
Figure 5:
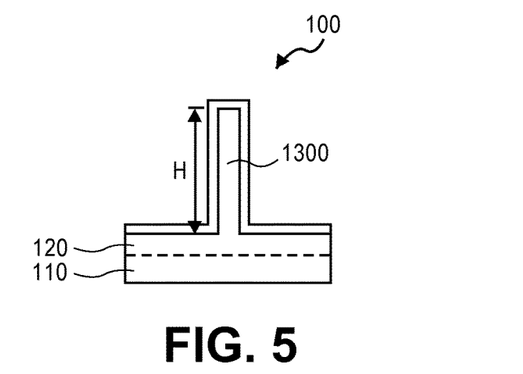
FIG. 5 shows the structure of FIG. 3 following the introduction of a catalyst layer on the fin of the device.

FIG. 4 and FIG. 5 show the structure of FIG. 2 and FIG. 3, respectively, following the introduction (e.g., deposition) of catalyst layer 165 on fin 1300, in one embodiment, catalyst layer 165 is a material that is selected to enhance an oxidation of a material of fin 1300. In one embodiment, a material that enhances an oxidation of a material of fin 1300 is a material selected to reduce an oxidation temperature of the fin material. Representatively, a fin material of a semiconductor will oxidize in a hydrogen and oxygen environment at approximately 1000° C. In one embodiment, catalyst layer 165 is a material that will promote an oxidation of a material of fin 1300 at a temperature less than 1000° C., such as on the order of 600° C. or less (e.g., 500° C.). A suitable material for catalyst layer is an aluminum oxide ($Al_2O_3$). Representatively, a catalyst layer of aluminum oxide may be introduced through an atomic layer deposition process to a thickness on the order of 10 nm or less. As shown in FIG. 5, catalyst layer 165 is conformally deposited on fin 1300 and, in one embodiment, a base of the substrate (on buffer layer 120) in gate electrode region 145.

Figure 6:
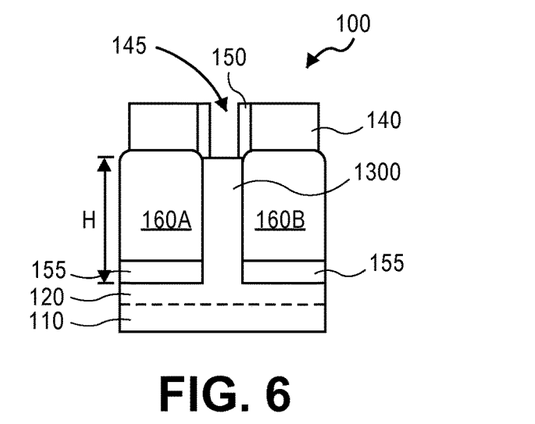
FIG. 6 shows the structure of FIG. 4 following a removal or recessing of a portion of the catalyst layer.
Figure 7:
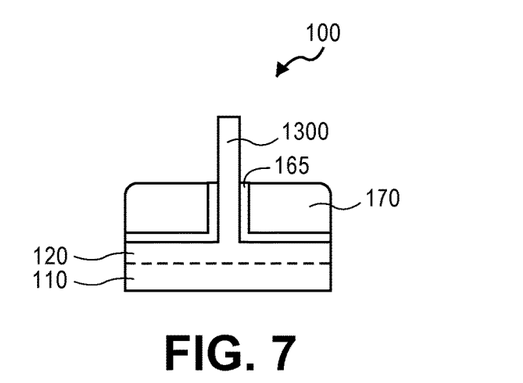
FIG. 7 shows the structure of FIG. 5 following a removal or recessing of a portion of the catalyst layer.

FIG. 6 and FIG. 7 show the structure of FIG. 4 and FIG. 5, respectively, following a removal or recessing of a portion of catalyst layer 165. Catalyst layer 165, in one embodiment, is reduced to a height selected for modification of fin 1300. Representatively, catalyst layer 165 is recessed by introducing a sacrificial fill layer into the gate electrode region, followed by a dry etch and wet etch combination. Catalyst layer 165 is formed on fin 1300 from its base to a height less than an apex of the fin as viewed. FIG. 7 shows sacrificial fill layer 170 introduced to a height of catalyst layer 165. Suitable materials for sacrificial fill layer 170 include flowable oxides, such as a carbon hot mask. As illustrated in FIG. 7, following the recess process, the catalyst layer 165 remains around a bottom portion of fin 1300.

Figure 8:
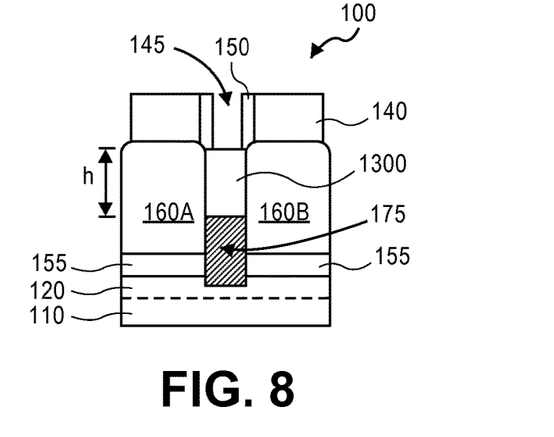
FIG. 8 shows the structure of FIG. 6 following a modification of a portion of the fin.
Figure 9:
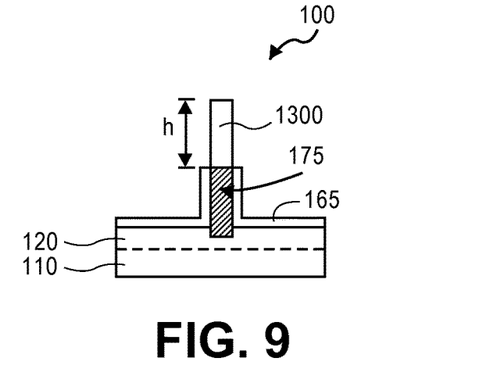
FIG. 9 shows the structure of FIG. 7 following a modification of a portion of the fin.

FIG. 8 and FIG. 9 show the structure of FIG. 6 and FIG. 7, respectively, following a removal of the sacrificial fill layer by, for example, a selective etch and a modification of a portion of fin 1300. The modification follows the removal of the sacrificial fill layer. The modification, in this embodiment, is an oxidation of a lower portion of fin 1300. In one embodiment, an oxidation of a portion of fin 1300 is performed at a temperature less than a conventional temperature for oxidation (e.g., a temperature less than 1000° C.). The oxidation of a lower portion of fin 1300 at, for example, a temperature less than an oxidation temperature of the material is accomplished through the presence of catalyst layer 165. FIG. 8 and FIG. 9 show oxidized portion 175 of fin 1300. Following the modification, fin 1300 has an active portion (e.g., a non-oxidized portion) having a height, h.

Figure 10:
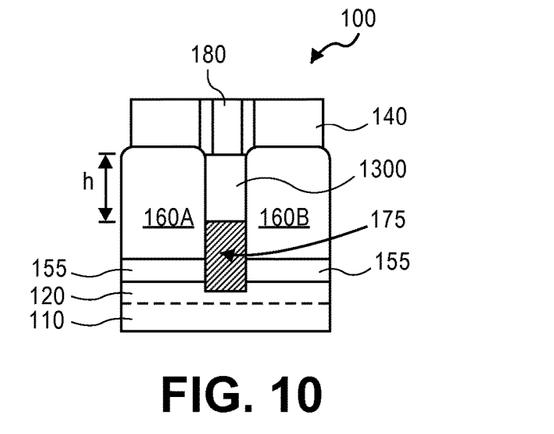
FIG. 10 shows the structure of FIG. 8 following a removal of the catalyst layer, the introduction of dielectric material in the gate electrode region to a height of the modified portion of a fin, and the introduction of a gate stack on the fin.
Figure 11:
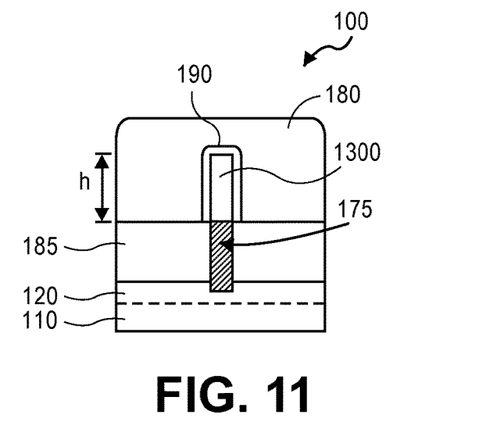
FIG. 11 shows the structure of FIG. 9 following a removal of the catalyst layer, the introduction of dielectric material in the gate electrode region to a height of the modified portion of a fin, and the introduction of a gate stack on the fin.

FIG. 10 and FIG. 11 show the structure of FIG. 8 and FIG. 9, respectively, following a removal of catalyst layer 165 by, for example, a selective etch process and the introduction of dielectric material in the gate electrode region to a height of modified portion 175 of fin 1300. Following the introduction of dielectric layer 185 in the gate electrode region, a gate stack is introduced, e.g., deposited, on the structure including a gate dielectric and gate electrode. In an embodiment, gate electrode 180 of the gate electrode stack is composed of a metal gate and gate dielectric layer 190 is composed of a material having a dielectric constant greater than a dielectric constant of silicon dioxide (a high-K material). For example, in one embodiment, gate dielectric layer 190 is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. In one embodiment, gate electrode 180 is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides.

As illustrated in FIGS. 10 and 11, the active portion of fin 1300 has a height, h, with gate electrode 180 surrounding the fin. As illustrated, modified height, h, of fin 1300 is less than the starting height, h, of fin 1300 illustrated, for example, in FIGS. 2 and 3.

Figure 12:
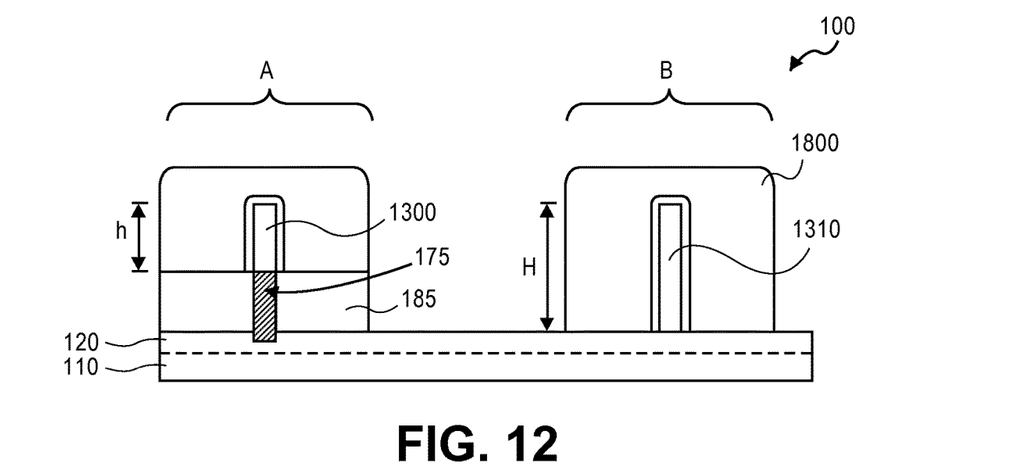
FIG. 12 shows an expanded view of the structure of FIG. 11 to show the presence of two devices on the substrate.

FIG. 12 shows an expanded view of the structure of FIG. 11 to show the presence of two devices on the substrate. Device A is the device illustrated in FIG. 11. Device B is a second three-dimensional or non-planar multi-gate device including channel or fin 1310 and gate electrode 1800. Device A has a modified fin height, h. Device B on the same substrate has a fin height, H, (fin 1310) greater than the modified fin height, h, of device A. Thus, according to the process described herein, a method is illustrated for integrating devices of different fin heights on the same structure. Device A has a representatively shorter fin or channel than device B. Representatively, device A might be used in applications requiring lower capacitance and desiring less leakage. One example is a device for graphic applications. Device B, representatively, may be used for high performance applications where a high current is desired. In the illustration, device A has a fin height, h, approximately half the size of a fin height of device B. It is appreciated that a fin height may be modified to any desired height, including half the height, three-quarters of the height, one-quarter of the height, etc.

Figure 13:
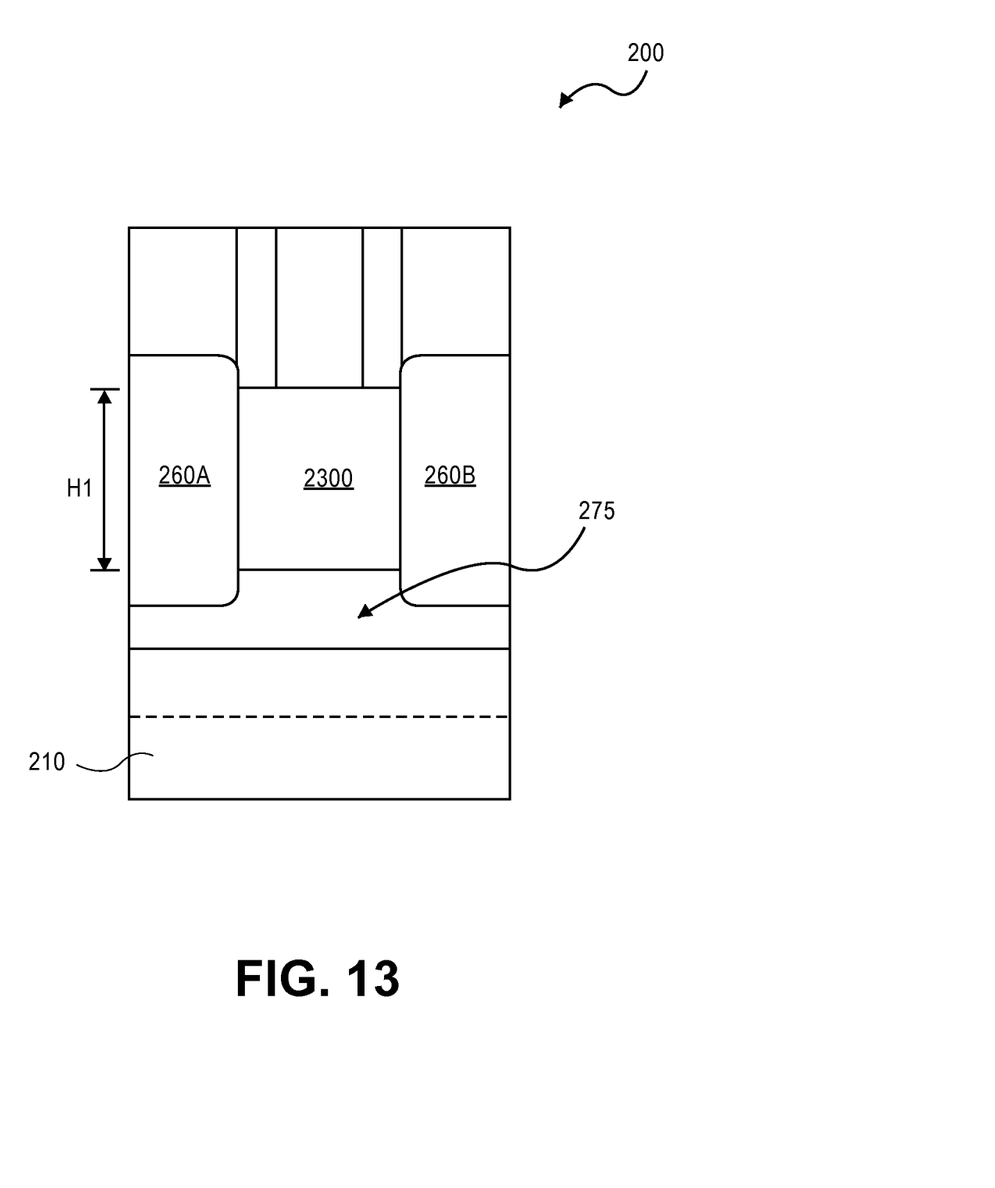
FIG. 13 shows a cross-section of another embodiment of a device structure.

FIG. 13 shows a cross-section of another embodiment of a device structure. In this embodiment, a non-planar semiconductor such as a three-dimensional fin-fet utilizes a modified region beneath the junction regions to isolate a channel of the device. Referring to FIG. 13, device 200 includes fin 2300 as a channel region. Fin 2300 has fin height, H1, with junction region 260A and junction region 260B on opposite sides of the fin. Rather than having implants or dopant regions beneath each junction region, the device includes modified region 275. In one embodiment, modified region 275 is an oxidized region that may be formed as described above in reference to FIGS. 2-11. In one embodiment, the modification of fin 2300 is exclusively at its base so that the fin (channel) has approximately a full targeted fin height. In this embodiment, the oxidation of the structure includes not only a bottom portion of fin 230, but also oxidized regions beneath junction regions 260A and 260B. It is appreciated that, in other embodiments, larger portions of fin 2300 may also be modified (e.g., oxidized) if desired.

In an alternative embodiment, rather than forming structure 200 according to the process described above with reference to FIGS. 2-11, the oxidation of a bottom portion of a fin and regions beneath the junction regions may be done prior to the formation of the junction regions 260A and 260B.

Figure 14:
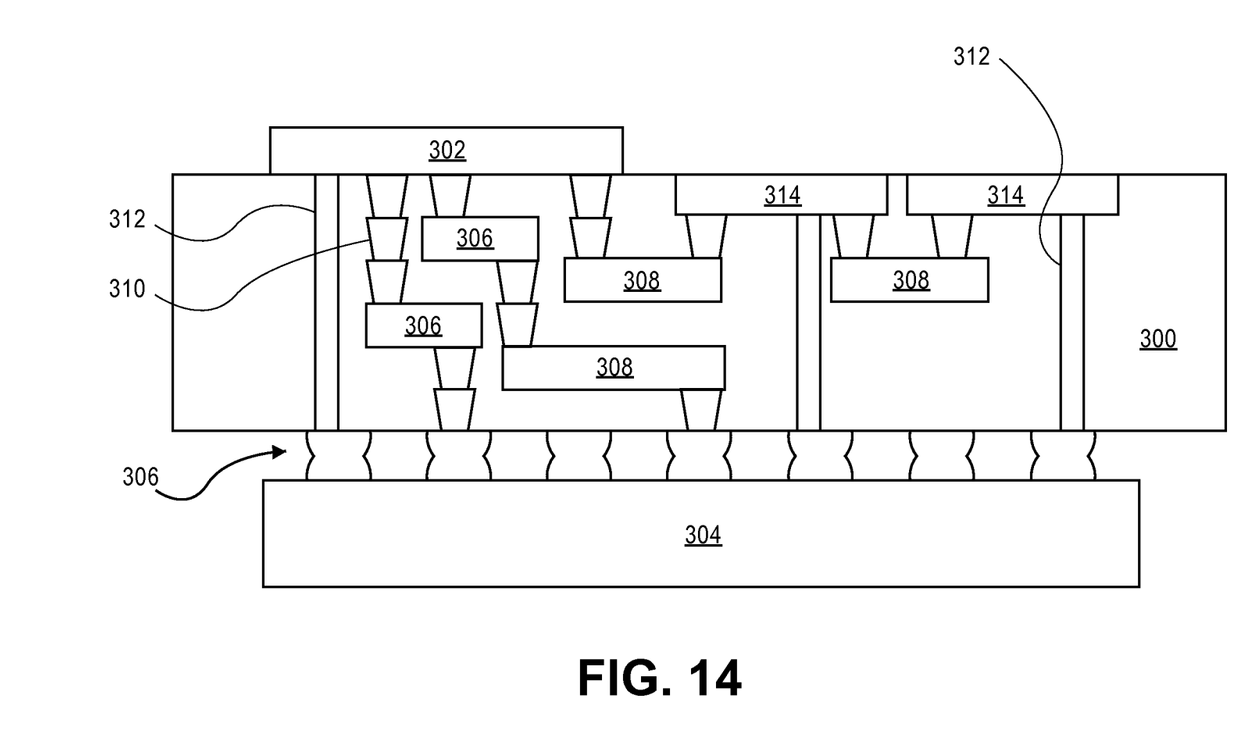
FIG. 14 is an interposer implementing one or more embodiments.

FIG. 14 illustrates an interposer that includes one or more embodiments. Interposer 300 is an intervening substrate used to bridge first substrate 302 to second substrate 304. First substrate 302 may be, for instance, an integrated circuit die. Second substrate 304 may be, for instance, a memory module, a computer motherboard, or another integrated circuit die. Generally, the purpose of interposer 300 is to spread a connection to a wider pitch or to reroute a connection to a different connection. For example, interposer 300 may couple an integrated circuit die to ball grid array (BGA) 306 that can subsequently be coupled to second substrate 304. In some embodiments, first and second substrates 302/304 are attached to opposing sides of interposer 300. In other embodiments, first and second substrates 302/304 are attached to the same side of interposer 300. In further embodiments, three or more substrates are interconnected by way of interposer 300.

Interposer 300 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 308 and vias 310, including but not limited to through-silicon vias (TSVs) 312. Interposer 300 may further include embedded devices 314, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on interposer 300.

In accordance with embodiments, apparatuses or processes disclosed herein may be used in the fabrication of interposer 300.

Figure 15:
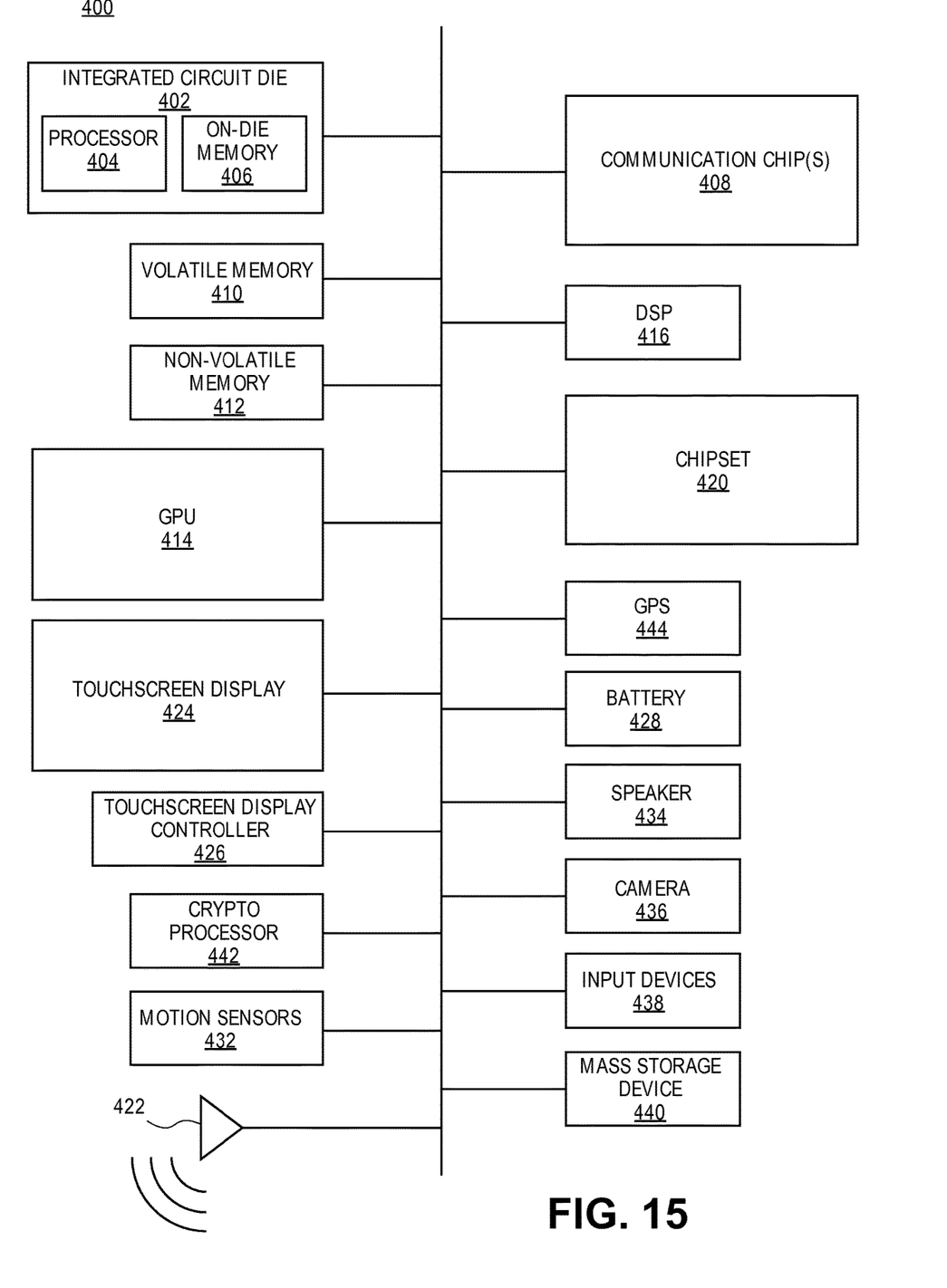
FIG. 15 illustrates an embodiment of a computing device.

FIG. 15 illustrates computing device 400 in accordance with one embodiment. Computing device 400 may include a number of components. In one embodiment, these components are attached to one or more motherboards. In an alternate embodiment, these components are fabricated onto a single system-on-a-chip (SoC) die rather than a motherboard. The components in computing device 400 include, but are not limited to, integrated circuit die 402 and at least one communication chip 408. In some implementations communication chip 408 is fabricated as part of integrated circuit die 402. Integrated circuit die 402 may include CPU 404 as well as on-die memory 406, often used as cache memory, that can be provided by technologies such as embedded DRAM (eDRAM) or spin-transfer torque memory (STTM or STTM-RAM).

Computing device 400 may include other components that may or may not be physically and electrically coupled to the motherboard or fabricated within an SoC die. These other components include, but are not limited to, volatile memory 410 (e.g., DRAM), non-volatile memory 412 (e.g., ROM or flash memory), graphics processing unit 414 (GPU), digital signal processor 416, crypto processor 442 (a specialized processor that executes cryptographic algorithms within hardware), chipset 420, antenna 422, display or a touchscreen display 424, touchscreen controller 426, battery 428 or other power source, a power amplifier (not shown), global positioning system (GPS) device 444, compass 430, motion coprocessor or sensors 432 (that may include an accelerometer, a gyroscope, and a compass), speaker 434, camera 436, user input devices 438 (such as a keyboard, mouse, stylus, and touchpad), and mass storage device 440 (such as hard disk drive, compact disk (CD), digital versatile disk (DVD), and so forth).

Communications chip 408 enables wireless communications for the transfer of data to and from computing device 400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 408 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 400 may include a plurality of communication chips 408. For instance, first communication chip 408 may be dedicated to shorter range wireless communications such as Wi-Fi and Bluetooth and a second communication chip 408 may be dedicated to longer range wireless communications such as GPS, EDGE, GPRS, CDMA, WiMAX, LTE, Ev-DO, and others.

Processor 404 of computing device 400 includes one or more devices, such as transistors or metal interconnects, that are formed in accordance with embodiments described herein including three-dimensional multi-gate transistor devices having tailored fin heights for a particular application (e.g., different fin heights on processor 404). The term "processor" may refer to any device or portion of a device that processes electronic data from registers and/or memory to transform that electronic data into other electronic data that may be stored in registers and/or memory.

The communication chip 408 may also include one or more devices, such as transistors or metal interconnects, that are formed in accordance with embodiments described above including three-dimensional transistor devices including modified or tailored fin heights.

In further embodiments, another component housed within the computing device 400 may contain one or more devices, such as transistors or metal interconnects, that are formed in accordance with implementations described above including three-dimensional transistor devices including modified or tailored fin heights.

In various embodiments, computing device 400 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, computing device 400 may be any other electronic device that processes data.

EXAMPLES

The following examples pertain to embodiments.

Example 1 is a method including forming a non-planar conducting channel of a multi-gate device on a substrate, the channel including a height dimension defined from a base at a surface of the substrate; modifying less than an entire portion of the channel; and forming a gate stack on the channel, the gate stack including a dielectric material and a gate electrode.

In Example 2, modifying of Example 1 includes oxidizing and prior to oxidizing less than an entire portion of the channel, the method includes forming a layer of a catalyst material on the channel, wherein the catalyst material includes a material having a property that will enhance oxidation of a material of the channel.

In Example 3, oxidizing the channel of Example 2 includes subjecting the channel to a temperature less than an oxidation temperature of a material of the channel.

In Example 4, the layer of the catalyst material of Example 2 is formed exclusively at a base of the channel.

In Example 5, the layer of the catalyst material of Example 2 is formed on the channel from the base of the channel to a height less than an apex of the channel.

In Example 6, the layer of the catalyst material of Example 5 is formed on half of the length of the channel.

In Example 7, forming the catalyst layer of Example 3 includes depositing the catalyst layer on the entire height dimension of the channel, and, after depositing, the method includes removing the layer of the catalyst material from a portion of the height dimension of the channel.

In Example 8, the channel of Example 1 or Example 2 is disposed between junction regions on the substrate, the method further including oxidizing a portion of the substrate beneath the junction regions.

In Example 9, prior to forming of the gate stack, the method of Example 1 or Example 2 includes introducing a dielectric material adjacent to the channel to a height equivalent to the oxidized portion of the channel.

Example 10 is a method including forming a non-planar conducting channel of a multi-gate device on a substrate; oxidizing a portion of the channel, the portion oxidized defined by a height dimension of the channel measured from a surface of the substrate that is less than an overall height dimension of the channel; and forming a gate stack on the channel, the gate stack including a dielectric material and a gate electrode.

In Example 11, prior to oxidizing less than an entire portion of the channel, the method of Example 10 includes forming a layer of a catalyst material on the channel, wherein the catalyst material includes a material having a property that will enhance oxidation of a material of the channel.

In Example 12, oxidizing the channel of Example 11 includes subjecting the channel to a temperature less than an oxidation temperature of a material of the channel.

In Example 13, forming the layer of the catalyst material on the channel of Example 11 includes depositing the layer of the catalyst material on an entire portion of the channel and prior to oxidizing, the method further including removing a portion of the layer of the catalyst material.

In Example 14, removing a portion of the layer of the catalyst material of Example 13 includes removing the layer from at least one half of the overall height dimension of the channel.

In Example 15, the channel of any of Examples 10-14 is disposed between junction regions on the substrate, the method further including oxidizing a portion of the substrate beneath the junction regions.

In Example 16, prior to forming the gate stack, the method of any of Examples 10-15 includes introducing a dielectric material adjacent to the channel to a height equivalent to the oxidized portion of the channel.

Example 17 is an apparatus including a non-planar multi-gate device on a substrate including a channel including a height dimension defining a conducting portion and a modified portion and a gate stack disposed on the channel, the gate stack including a dielectric material and a gate electrode.

In Example 18, the gate stack of Example 17 is disposed exclusively on the conducting portion of the channel.

In Example 19, the modified portion of the channel of Example 17 or Example 18 is disposed between the substrate and the conducting portion of the channel.

In Example 20, the multi-gate device of Example 17 or Example 18 is a first multi-gate device, the apparatus further including a second multi-gate device including a channel including a conducting portion having a height dimension greater than a height dimension of the conducting portion of the first multi-gate device.

In Example 21, the modified portion of the channel of Example 17 or Example 18 is oxidized.

In Example 22, the multi-gate device of Example 17 or Example 18 further includes a junction region on each of opposite sides of the channel and a region beneath the junction region is oxidized.

The above description of illustrated implementations, including what is described in the Abstract, is not intended to be exhaustive or to limit the invention to the precise forms disclosed. While specific implementations of, and examples for, the invention are described herein for illustrative purposes, various equivalent modifications are possible within the scope, as those skilled in the relevant art will recognize.

These modifications may be made in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

What is claimed is:

1. A method comprising:
forming a non-planar conducting channel of a multi-gate device on a substrate, the channel comprising a height dimension defined from a base at a surface of the substrate;
forming a layer of a catalyst material on the channel, wherein the catalyst material comprises a material having a property that accelerates oxidation of a material of the channel;
oxidizing less than an entire portion of the channel to form an insulator portion of the channel, wherein the insulator portion of the channel is an oxidized portion of a same semiconductor material as the semiconductor material of the non-oxidized portion of the channel, and the insulator portion of the channel has a top surface, wherein the channel is disposed between junction regions on the substrate, wherein the junction region on each of opposite sides of the channel has a bottom surface below a bottom surface of a conducting portion of the channel, and wherein there is no oxide material beneath and in contact with the bottom surface of the junction region on each of opposite sides of the channel;
forming a gate stack on the channel, the gate stack comprising a dielectric material and a gate electrode, wherein the gate stack has a bottom surface co-planar with the top surface of the insulator portion of the channel; and
forming a second gate stack on a second channel of a second multi-gate device on the substrate, wherein the second channel does not include an insulator portion, wherein the second channel of the second multi-gate device has a bottommost surface above a bottommost surface of the insulator portion of the channel of the multi-gate device, and wherein the non-oxidized portion of the channel of the multi-gate device has a vertical length less than a vertical length of the second channel of the second multi-gate device.

2. The method of claim 1, wherein oxidizing the channel comprises subjecting the channel to a temperature less than an oxidation temperature of a material of the channel.

3. The method of claim 1, wherein the layer of the catalyst material is formed exclusively at a base of the channel.

4. The method of claim 1, wherein the layer of the catalyst material is formed on the channel from the base of the channel to a height less than an apex of the channel.

5. The method of claim 4, wherein the layer of the catalyst material is formed on half of the length of the channel.

6. The method of claim 1, wherein forming the catalyst layer comprises depositing the catalyst layer on the entire height dimension of the channel, and, after depositing, the method comprises removing the layer of the catalyst material from a portion of the height dimension of the channel.

7. The method of claim 1, wherein prior to forming of the gate stack, the method comprises introducing a dielectric material adjacent to the channel to a height equivalent to the insulator portion of the channel.

8. A method comprising:
forming a non-planar conducting channel of a multi-gate device on a substrate;
forming a layer of a catalyst material on the channel, wherein the catalyst material comprises a material having a property that enhances oxidation of a material of the channel, the catalyst material comprising aluminum oxide;
oxidizing a portion of the channel to form an insulator portion of the channel, the insulator portion defined by a height dimension of the channel measured from a surface of the substrate that is less than an overall height dimension of the channel, wherein the insulator portion of the channel is an oxidized portion of a same semiconductor material as the semiconductor material of the non-oxidized portion of the channel, and the insulator portion of the channel has a top surface, wherein the channel is disposed between junction regions on the substrate, wherein the junction region on each of opposite sides of the channel has a bottom surface below a bottom surface of a conducting portion of the channel, and wherein there is no oxide material beneath and in contact with the bottom surface of the junction region on each of opposite sides of the channel;
forming a gate stack on the channel, the gate stack comprising a dielectric material and a gate electrode, wherein the gate stack has a bottom surface co-planar with the top surface of the insulator portion of the channel; and
forming a second gate stack on a second channel of a second multi-gate device on the substrate, wherein the second channel does not include an insulator portion, wherein the second channel of the second multi-gate device has a bottommost surface above a bottommost surface of the insulator portion of the channel of the multi-gate device, and wherein the non-oxidized portion of the channel of the multi-gate device has a vertical length less than a vertical length of the second channel of the second multi-gate device.

9. The method of claim 8, wherein oxidizing the channel comprises subjecting the channel to a temperature less than an oxidation temperature of a material of the channel.

10. The method of claim 8, wherein forming the layer of the catalyst material on the channel comprises depositing the layer of the catalyst material on an entire portion of the channel and prior to oxidizing, the method further comprising removing a portion of the layer of the catalyst material.

11. The method of claim 10, wherein removing a portion of the layer of the catalyst material comprises removing the layer from at least one half of the overall height dimension of the channel.

12. The method of claim 8, wherein prior to forming the gate stack, the method comprises introducing a dielectric material adjacent to the channel to a height equivalent to the insulator portion of the channel.

13. An apparatus comprising:
a non-planar multi-gate device on a substrate comprising a channel comprising a height dimension defining a conducting portion and an insulator portion, and a gate stack disposed on the channel, wherein the insulator portion of the channel is an oxidized portion of a same semiconductor material as the semiconductor material of the non-oxidized portion of the channel, and the insulator portion of the channel has a top surface, the gate stack comprising a dielectric material and a gate electrode, wherein the gate stack has a bottom surface co-planar with the top surface of the insulator portion of the channel, wherein the multi-gate device further comprises a junction region on each of opposite sides of the channel, wherein the junction region on each of opposite sides of the channel has a bottom surface below a bottom surface of the conducting portion of the channel, and wherein there is no oxide material beneath and in contact with the bottom surface of the junction region on each of opposite sides of the channel; and a second non-planar multi-gate device on the substrate, the second non-planar multi-gate device comprising a second gate stack on a second channel, wherein the second channel does not include an insulator portion, wherein the second channel of the second non-planar multi-gate device has a bottommost surface above a bottommost surface of the insulator portion of the channel of the non-planar multi-gate device, and wherein the non-oxidized portion of the channel of the multi-gate device has a vertical length less than a vertical length of the second channel of the second multi-gate device.

14. The apparatus of claim 13, wherein the gate stack is disposed exclusively on the conducting portion of the channel.

15. The apparatus of claim 13, wherein the insulator portion of the channel is disposed between the substrate and the conducting portion of the channel.

* * * * *